United States Patent
Yamaguchi

(10) Patent No.: US 6,337,455 B1
(45) Date of Patent: Jan. 8, 2002

(54) PROCESS AND APPARATUS FOR TRANSFORMING METAL MATERIAL

(75) Inventor: Katsumi Yamaguchi, 1303, Kuboyama, Nagakute-cho, Aichi-gun, Aichi (JP)

(73) Assignees: Katsumi Yamaguchi, Tokyo; Xebec International Corporation, Aichi, both of (JP)

( * ) Notice: Subject to any disclaimer, the term of this patent is extended or adjusted under 35 U.S.C. 154(b) by 0 days.

(21) Appl. No.: 09/513,241

(22) Filed: Feb. 25, 2000

(30) Foreign Application Priority Data

Feb. 26, 1999 (JP) .......................................... 11-049324

(51) Int. Cl.⁷ ............................................... B23K 9/04
(52) U.S. Cl. ...................... 219/76.14; 219/74; 219/123; 219/137.2
(58) Field of Search .......................... 219/137 R, 123, 219/56.22, 76.15, 76.16, 137.2; 427/449

(56) References Cited

U.S. PATENT DOCUMENTS 3,433,924 A * 3/1969 Sevenco ................... 219/123
4,970,091 A * 11/1990 Buhrmaster et al. ......... 427/449
5,281,789 A * 1/1994 Merz et al. ............... 219/76.15
5,616,258 A * 4/1997 Dreizin et al. ........... 219/137 R
5,707,693 A * 1/1998 Vliet et al. ............... 219/76.15
5,796,064 A * 8/1998 Rice et al. ................ 219/76.15
6,091,043 A * 7/2000 White et al. ............. 219/137 R

FOREIGN PATENT DOCUMENTS

| JP | 10-156524 | 6/1998 |
| JP | 10-193079 | 7/1998 |
| JP | 10-195676 | 7/1998 |
| JP | 10-226803 | 8/1998 |

* cited by examiner

Primary Examiner—Clifford C. Shaw
(74) Attorney, Agent, or Firm—Pillsbury Winthrop LLP

(57) ABSTRACT

A metal material is formed into a wire material, and an end of the wire material is molten by an electric discharge. A molten sphere formed by the melting of the end is flied by a gas flow. Thus, a material having a high melting point can be ejected.

10 Claims, 3 Drawing Sheets

PROCESS AND APPARATUS FOR TRANSFORMING METAL MATERIAL

BACKGROUND OF THE INVENTION

1. Field of the Invention

The present invention relates to a process and apparatus for transforming a metal material, which can be used for a metal having a high melting point exceeding 1,000° C., particularly, such as gold, nickel and the like.

2. Description of the Related Art

At present, there are a large number of shaping processes for making complicated micro-shapes. However, most of the processes are based on the viewpoint of only the shaping, and there is almost no process in which functions of metals are integrated.

Therefore, metal jet processes has been already proposed in Japanese Patent Application Laid-open Nos.10-156524, 10-193079, 10-195676 and 10-226803, for shaping a three-dimensional functional structure by effectively utilizing the function of a metal material.

Each of the processes is intended to produce any three-dimensional structure by ejecting a molten metal in the form of dots, scanning the surface of a substrate by a computer control to describing a two-dimensional picture image, and laminating the picture image.

However, the processes proposed hitherto are those which involves guiding a molten metal into a nozzle and ejecting the molten metal present in the nozzle. Therefore, only the metal having a low melting point can be used, and many practical metals having a high melting point used as a functional material cannot be utilized.

This is because an apparatus including a nozzle must withstand a high-temperature state in order to use a material having a high melting point. In usual, the melting point of iron is 1,5350° C., and when iron is used as a material, an apparatus withstanding the heating up to 1,5350° C. is required. The temperature of fire generated by a lighter is approximately 9000° C., and the temperature of fire generated by a gas oven is also equal to this temperature. When an electric oven producing a large output power is used, the entire apparatus is molten.

SUMMARY OF THE INVENTION

Accordingly, it is an object of the present invention to provide a process and apparatus for transforming a metal material, wherein a material having a high melting point can be ejected.

To achieve the above object, according to a first aspect and feature of the present invention, there is provided a process for transforming a metal material, comprising the steps of forming a metal material into a wire material, melting an end of the wire material by electrical discharge, and flying a molten sphere formed by the melting of the end by a gas flow.

With this feature, in order to form the molten sphere by the electric discharge at the end of the wire material and to fly the molten sphere by the gas flow, the molten sphere having a high temperature can be formed without contact with a primary device such as a nozzle, and the primary device such as the nozzle around the molten sphere can be cooled by the gas flow. Therefore, a material having a high melting point can be transformed.

According to a second aspect and feature of the present invention, there is provided a process for transforming a metal material, comprising the steps of disposing an electrode in the vicinity of an opening of a fine bore having a predetermined length enough to deliver a gas and a wire material, melting an end of the wire material by electric discharge provided between the wire material and the electrode in a state in which the wire material has been located to protrude out of the opening, and flying a molten sphere formed by the melting of the end by a gas flow delivered from the opening.

With the second feature, the opening is to be closed by the molten sphere formed by the electric discharge, but a drag is applied to the molten sphere by the gas flow ejected from the fine bore, whereby the molten metal can be flied. Therefore, the molten sphere having a high temperature can be formed and flied without contact with a primary device such as a nozzle, and the primary device such as the nozzle and the wire material can be cooled by the gas flow.

According to a third aspect and feature of the present invention, in addition to the second feature, the gas flow is generated around the outer periphery of the opening.

With the third feature, the direction of flying of the molten metal can be defined by the gas flow generated around the outer periphery of the fine bore, and hence, the molten metal can be guided to a target position.

According to a fourth aspect and feature of the present invention, in addition to the second feature, an electric field or a magnetic field is generated in the fine bore.

With the fourth feature, the position of the wire material in the fin e bore can be defined by the electric field or magnetic field generated in the fine bore, whereby the position of formation of the molten metal can be regularized. Therefore, the molten sphere can be guided to a target position.

According to a fifth aspect and feature of the present invention, in addition to any of the first to fourth features, the metal material used is a metal having a high melting point exceeding 1,000° C.

With the fifth feature, a material having a high melting point can be used, and a structure can be shaped by effectively utilizing the function of a metal material having a high melting point and used practically.

According to a sixth aspect and feature of the present invention, there is provided an apparatus for transforming a metal material by a process for a metal material according to any of the first to fourth feature.

With the sixth feature, a structure can be shaped by effectively utilizing the function of a metal material having a high melting point and us ed practically.

Thus, the metal material transforming process and apparatus are applicable in various industrial fields. For example, in a one-dimensional application, a metal sphere is formed from a metal material having a high melting point such as gold and copper, whereby a soldering and a wiring can be carried out using this metal sphere. In a two-dimensional application, letters can be formed as in an ink jet printer, and pictures can be drawn in different colors by changing the type of the used metal material. In a three-dimensional application, it is possible to shape a three-dimensional structure, to make a three-dimensional electric circuit, and to produce a three-dimensional inclined functional material.

The above and other objects, features and advantages of the invention will become apparent from the following description of the preferred embodiment taken in conjunction with the accompanying drawings.

DESCRIPTION OF THE PREFERRED EMBODIMENTS

The present invention will now be described by way of embodiments with reference to the accompanying drawings.

Figure 1:
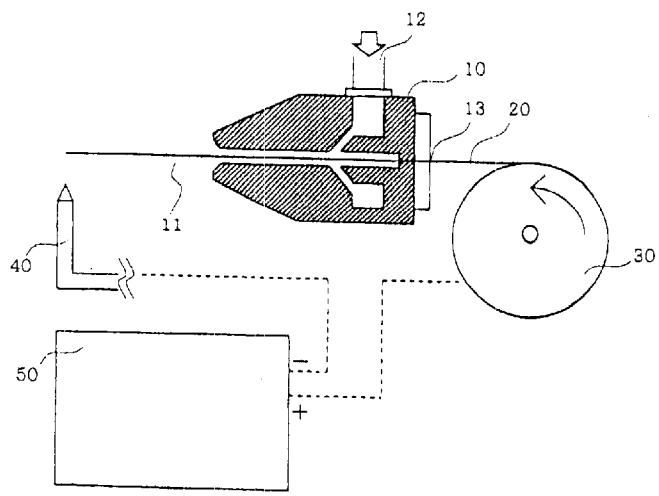
FIG. 1 is an illustration of the arrangement of a transforming apparatus according to an embodiment of the present invention.

FIG. 1 shows the arrangement of a transforming apparatus used in a process for transforming a metal material according to an embodiment of the present invention.

As shown in FIG. 1, the transforming apparatus has a primary device 10 constituting a nozzle or the like. The primary device 10 includes a fine bore 11 which has a predetermined length and through which a wire material 20 and a gas are passed, a gas supply section 12 for supplying the gas into the fine bore 11, and a bore 13 for supplying the wire material 20 into the fine bore 11. It is preferable that the opening of the fine bore 11 is gradually divergent outwards. It is also preferable that the bore 13 is provided at a location in which it is aligned with an axis of the fine bore 11. Further, it is preferable that a gas flow path extending from the gas supply section 12 to the fine bore 11 is provided in a direction from the side of the bore 12 toward the side of the opening of the fine bore 11, so that a gas flow directed to the opening of the fine bore 11 is easily generated. The gas supplied from the gas supply section 12 may be air or the like, but if an inert gas is used, the oxidation of the metal can be prevented.

The wire material 20 is supplied to the primary device 10 of the transforming apparatus by means of a supply section 30. The supply section 30 is constituted, for example, using a stepping motor or the like, so that the wire material 20 can be supplied in a predetermined amount at one time.

An electrode 40 formed of tungsten or the like is disposed in the vicinity of the fine bore 11. Predetermined values of voltage and electric current are applied from a powder source 50 to the supply section 30 and the electrode The operation of the transforming apparatus will be described below.

The wire material 20 is passed via the bore 13 through the fine bore 11 and thus disposed in a state in which it has protruded out of a tip end of the fine bore 11, as shown in FIG. 1. On the other hand, a gas having a given pressure is constantly supplied from the gas supply section 12. The gas supplied from the gas supply section 12 into the apparatus body 10 is introduced into the fine bore 11. The gas introduced into the fine bore 11 is ejected in the form of a high-speed gas flow from the opening of the fine bore 11.

when a wire material 20 having a diameter of about 30 μm is used, it is difficult to conduct a method for delivering the wire material from the supply section by pushing-out. This is because the wire is buckled on the way by a pushing-out force. According to the present embodiment, a drawing force directed to the tip end of the fine bore is applied to the wire material 20 by a gas viscous resistance generated by the gas flow in the fine bore 11. Therefore, the wire material 20 is guided to protrude out of the tip end of the fine bore 11.

First, voltage is applied to the supply section 30 and the electrode 40 from the power source 50 in a state in which the wire material 20 has protruded from the tip end of the fine bore 11 by a predetermined length, as shown in FIG. 1. The application of the voltage produces an electric discharge at the end of the wire material 20 protruding out of the fine bore 11, whereby the end of the wire material 20 is molten into a spherical shape. The resulting molten sphere is flied by the gas flow ejected at a high speed from the fine bore 11.

When the molten sphere is flied, a predetermined amount of the wire material 20 is delivered from the supply section 30. Thus, the wire material 20 protrudes again from the tip end of the fine bore by a predetermined amount, because the drawing force directed toward the tip end of the fine bore 11 is applied to the wire material 20, as described above. In this state, the voltage is applied again to the wire material 20 by the power source 50.

The molten sphere can be flied continuously by repeating above-described operation.

Figure 3:
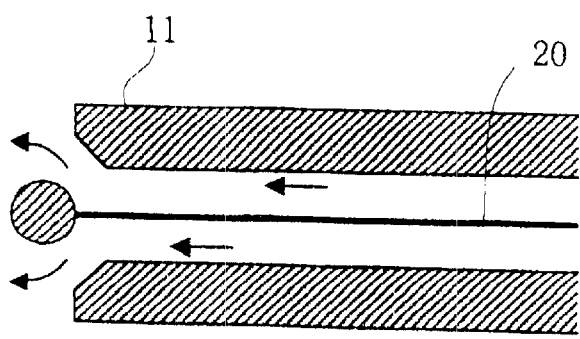
FIG. 3 is a diagram for explaining the operation until the molten sphere is formed and flied in the embodiment.
Figure 4:
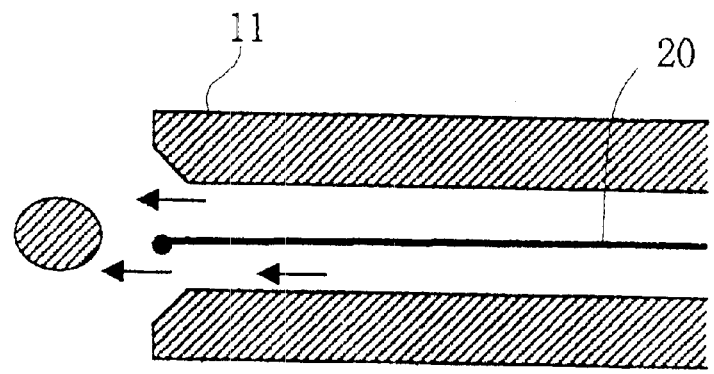
FIG. 4 is a diagram for explaining the operation until the molten sphere is formed and flied in the embodiment.

The operation conducted till the formation and flying of the molten sphere will be described below with reference to FIGS. 2 to 4.

Figure 2:
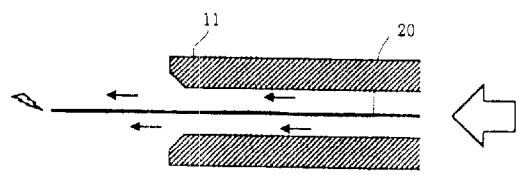
FIG. 2 is a diagram for explaining the operation until a molten sphere is formed and flied in the embodiment.

First, an electric discharge is provided in the state in which the wire material 20 has protruded out of the fine bore 11, as shown in FIG. 2.

This electric discharge causes the wire material 20 to be molten, starting with its preceding end, thereby forming a molten sphere at a location near the tip end of the fine bore by. This state is shown in FIG. 3. In this state, the molten sphere is exposed to the gas flow ejected out of the fine bore 11. Therefore, the molten sphere is separated from the wire material 20 and flied by the gas flow, as shown in FIG. 4.

An electrically discharging method will be described below.

In order to melt the used metal material to form the molten sphere by the electric discharge, it is preferable that the discharging method is carried out through two steps.

At the first step, a large value of voltage is generated for an extremely short time. The high voltage generated for the short time makes a chance to generate the electric discharge. If the applying time is prolonged, not only the electric discharge energy is increased, but also when the metal material is molten, the evaporation and scattering of the material are caused. At the subsequent step, the voltage value is controlled so that it is reduced and maintained at a low level.

Experiment examples will now be described.

A discharge current was set at 50 μA; a discharge time was set at 16 msec, and the distance between both of the electrodes was set at 200 μm. A gold wire having a diameter of 30 μm was used as a material for an anode, and tungsten was used as a cathode. First, voltage of about 2,000 V was applied for about 40 msec under the above-described conditions and then, the voltage value was maintained at 300 V for the remaining discharge time.

A molten sphere having a diameter of about 200 μm could be flied from the end of the goldwire by the above-described electric discharge.

Another experiment was carried out in the same manner using the transforming apparatus, except that a nickel wire having a diameter of 25 μm was used. As a result, as when the gold wire having the diameter of 30 μm, a molten sphere could be formed by the electric discharge and flied by the gas flow.

Figure 5:
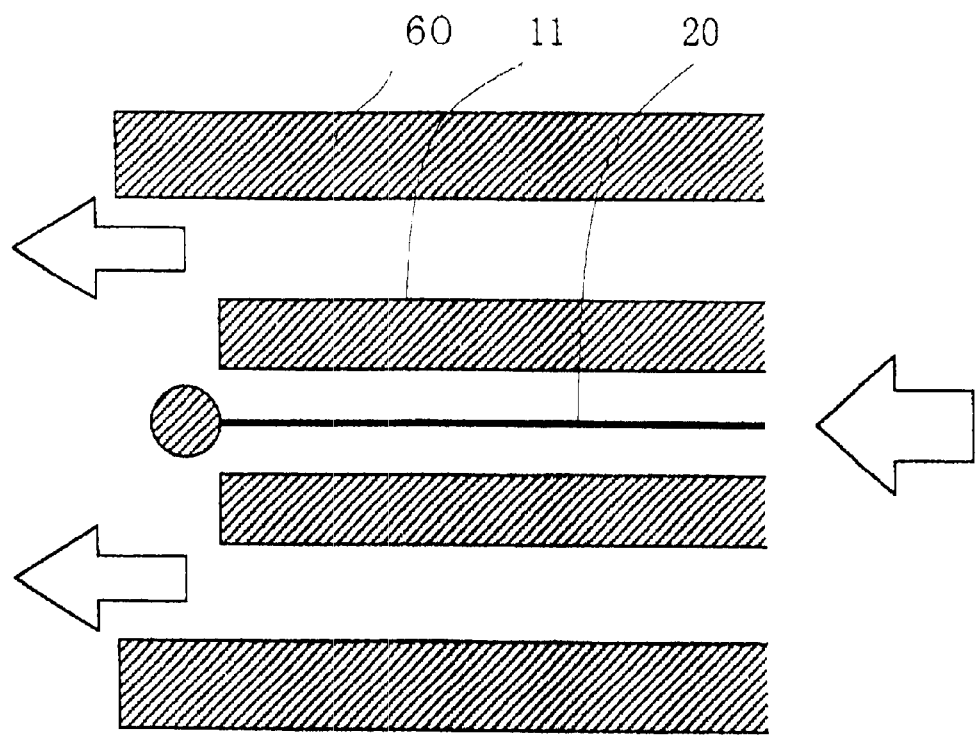
FIG. 5 is a diagram showing a fine bore area in another embodiment of the present invention.
Figure 6:
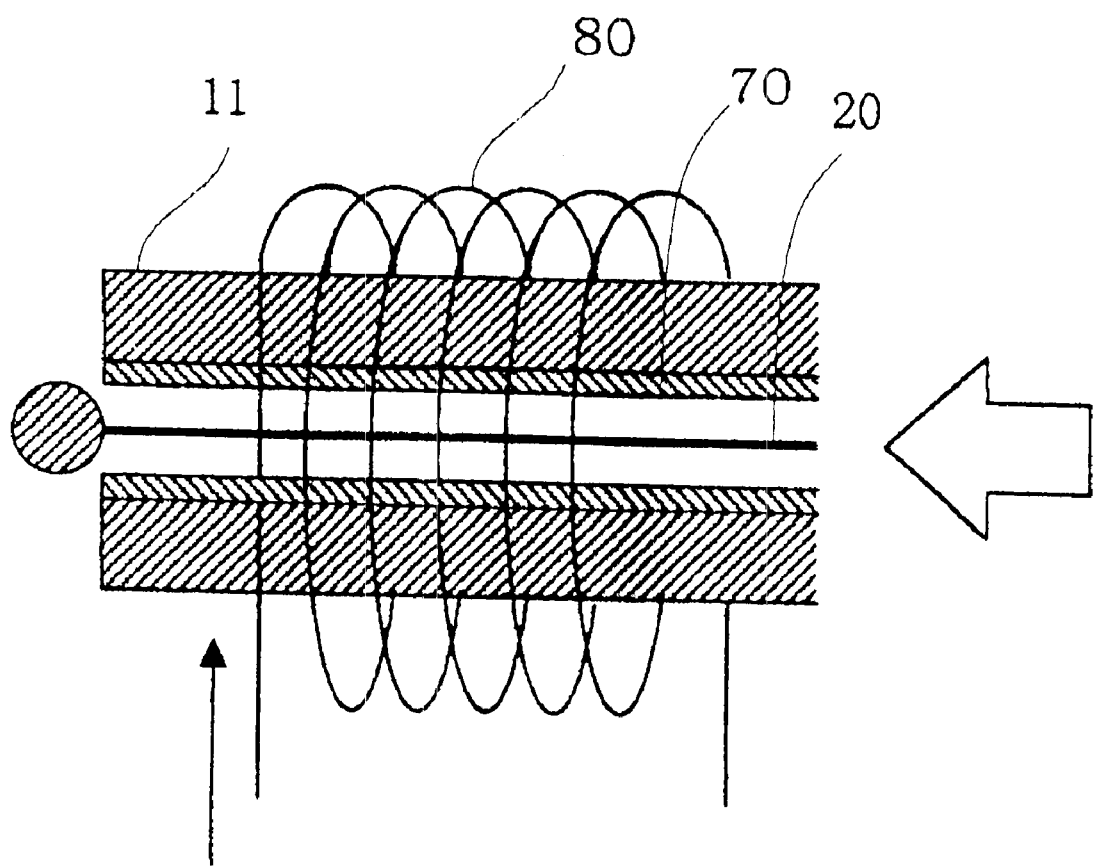
FIG. 6 is a diagram showing a fine bore area in a further embodiment of the present invention.

Other embodiments of the present invention will be described below. Both of FIGS. 5 and 6 show only fine bores. Any of these embodiments is intended to stabilize the flying of a molten sphere.

FIG. 5 shows a double-pipe structure in which a guide pipe 60 is provided around an outer periphery of a fine bore 11. A gas flow is also generated between the fine bore 11 and the guide pipe 60.

If the gas flow is generated around the outer periphery of the fine bore 11 in the above manner, the direction of flying of a molten metal can be defined by the new gas flow, thereby stabilizing the flying of the molten sphere.

In the embodiment shown in FIG. 6, an electric field is generated by a plated layer 70 provided on an inner peripheral surface of a fine bore 11, or a magnetic field is generated by a coil 80 provided around an outer periphery of the fine bore 11, whereby the position of a wire material 20 is retained centrally in the fine bore 11 to stabilize the flying of a molten sphere.

The present invention has been described as using the metal material having a high melting point in any of the embodiments, but a metal material having a low melting point may be used.

What is claimed is:

1. A process for transforming a metal material, comprising:

forming a metal material into a wire material;

feeding said wire material into an apparatus using a gas flow mechanism; said feeding being performed by a gas flow such that an end of said wire material protrudes beyond an opening of said apparatus;

melting the end of said wire material by electrical discharge;

and ejecting a molten sphere formed by the melting of the end, said ejecting being performed by the gas flow.

2. A process for transforming a metal material according to claim 1, wherein said metal material used is a metal having a high melting point exceeding 1,000° C.

3. A process for transforming a metal material according to claim 1, wherein the fine wire is guided by an electric or magnetic field generated within said apparatus.

4. A process for transforming a metal in the form of a fine wire, comprising:

disposing an electrode in the vicinity of an opening of a fine bore having a predetermined length, said predetermined length being sufficient to deliver a gas and the fine wire, feeding the fine wire into said fine bore such that an end of the fine wire protrudes from the fine bore, said feeding being performed by a gas flow;

melting the end of said wire material by electric discharge provided between said wire material and said electrode once said wire material has been positioned to protrude out of said opening; and ejecting a molten sphere formed by the melting of the end, said ejecting being perform ed by the gas flow delivered from said opening.

5. A process for transforming a metal in the form of a fine wire according to claim 4, wherein the gas flow is generated around the outer periphery of said opening.

6. A process for transforming a metal in the form of a fine wire according to claim 4, wherein said wire material and said molten sphere are guided by an electric or a magnetic field generated in said fine bore.

7. A process for transforming a metal material in the form of a fine wire according to claim 4, wherein said metal material is a metal having a high melting point exceeding 1,000° C.

8. An apparatus for transforming a metal material in the form of a fine wire comprising:

a fine bore of a predetermined length, said fine bore having an end portion and gas inlets for directing a gas flow towards said end portion;

a gas supply system connected to said gas inlets for supplying a gas flow into said fine bore, the gas flow feeding the fine wire into said fine bore;

an electrode positioned proximate to said end portion such that a portion of said fine wire protruding from said end portion of said fine bore will be melted by an electric discharge between said electrode and said fine wire; and a power supply connected to said electrode and said wire supply;

wherein melted droplets of said fine wire are ejected from said apparatus by said gas flow.

9. A process for transforming a metal material, comprising:

forming a metal material into a wire material;

feeding said wire material into an apparatus using a gas flow mechanism; said feeding being performed by a gas flow;

melting an end of said wire material by electrical discharge; and ejecting a molten sphere formed by the melting of the end, said ejecting being performed by the gas flow.

10. A process for transforming a metal in the form of a fine wire, comprising:

disposing an electrode in the vicinity of an opening of a fine bore having a predetermined length, said predetermined length being sufficient to deliver a gas and the fine wire, feeding the fine wire into said fine bore, said feeding being performed by a gas flow;

melting an end of said wire material by electric discharge provided between said wire material and said electrode once said wire material has been positioned to protrude out of said opening; and ejecting a molten sphere formed by the melting of the end, said ejecting being performed by the gas flow delivered from said opening.

* * * * *